United States Patent
Yang et al.

(10) Patent No.: US 11,515,145 B2
(45) Date of Patent: Nov. 29, 2022

(54) DEPOSITION OF SILICON BORON NITRIDE FILMS

(71) Applicant: Applied Materials, Inc., Santa Clara, CA (US)

(72) Inventors: Chuanxi Yang, Los Altos, CA (US); Hang Yu, San Jose, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 167 days.

(21) Appl. No.: 17/018,173

(22) Filed: Sep. 11, 2020

(65) Prior Publication Data
US 2022/0084809 A1    Mar. 17, 2022

(51) Int. Cl.
| | |
|---|---|
| H01L 21/02 | (2006.01) |
| C23C 16/38 | (2006.01) |
| C23C 8/36 | (2006.01) |
| C23C 8/24 | (2006.01) |
| H01L 21/033 | (2006.01) |

(52) U.S. Cl.
CPC ............ *H01L 21/0217* (2013.01); *C23C 8/24* (2013.01); *C23C 8/36* (2013.01); *C23C 16/38* (2013.01); *H01L 21/0234* (2013.01); *H01L 21/02271* (2013.01); *H01L 21/02329* (2013.01); *H01L 21/02211* (2013.01); *H01L 21/0332* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 6,815,350 B2 | 11/2004 | Kim et al. | |
| 7,633,125 B2 | 12/2009 | Lu et al. | |
| 2003/0232514 A1 | 12/2003 | Kim et al. | |
| 2016/0254136 A1* | 9/2016 | Sato | H01L 21/02123 |
| | | | 438/782 |
| 2018/0144927 A1 | 5/2018 | Pandey et al. | |
| 2019/0326110 A1 | 10/2019 | Gadre et al. | |

FOREIGN PATENT DOCUMENTS

| | | |
|---|---|---|
| JP | 2000332012 A | 11/2000 |
| WO | 2013123143 A1 | 8/2013 |

OTHER PUBLICATIONS

PCT International Search Report and Written Opinion in PCT/US2021/049375 dated Dec. 20, 2021, 10 pages.

* cited by examiner

*Primary Examiner* — Asok K Sarkar
(74) *Attorney, Agent, or Firm* — Servilla Whitney LLC

(57) ABSTRACT

Methods for forming a SiBN film comprising depositing a film on a feature on a substrate. The method comprises in a first cycle, depositing a SiB layer on a substrate in a chamber using a chemical vapor deposition process, the substrate having at least one feature thereon, the at least one feature comprising an upper surface, a bottom surface and sidewalls, the SiB layer formed on the upper surface, the bottom surface and the sidewalls. In a second cycle, the SiB layer is treated with a plasma comprising a nitrogen-containing gas to form a conformal SiBN film.

18 Claims, 2 Drawing Sheets

US 11,515,145 B2

DEPOSITION OF SILICON BORON NITRIDE FILMS

TECHNICAL FIELD

The present disclosure relates generally to methods of depositing thin films. In particular, the disclosure relates to processes for the deposition of silicon boron nitride films.

BACKGROUND

Silicon boron nitride thin films as a dielectric layer have been used in semiconductor fabrication processes. For example, SiBN films are used in multi-patterning processes as spacer materials to achieve smaller device dimensions without employing the most expensive EUV lithography technology. Additionally, SiBN can be used as a gate spacer material to isolate gate structure and contact areas to minimize potential leakage current.

Silicon boron nitride spacer fabrication processes include SiBN film deposition on 3D structures (e.g., fins). Conventional SiBN plasma enhanced chemical vapor deposition (PECVD) process results in low step coverage and low conformality. In addition, convention PECVD processes require very high process temperatures.

Therefore, there is a need in the art for processes of depositing conformal SiBN films that can be conducted at lower processing temperatures than existing processes.

SUMMARY

One or more embodiments of the disclosure are directed to processing methods. In a first embodiment, a method of forming a film on a substrate comprises in a first cycle, depositing a SiB layer on a substrate in a chamber using a chemical vapor deposition process, the substrate having at least one feature thereon, the at least one feature comprising an upper surface, a bottom surface and sidewalls, the SiB layer formed on the upper surface, the bottom surface and the sidewalls; and in a second cycle, treating the SiB layer with a plasma comprising a nitrogen-containing gas to form a conformal SiBN film.

In another embodiment, a method of forming a film on a substrate comprises in a first cycle, depositing a SiB layer on a substrate in a chamber using a chemical vapor deposition process, the substrate having at least one feature thereon, the at least one feature comprising an upper surface, a bottom surface and sidewalls, the SiB layer formed on the upper surface, the bottom surface and the sidewalls; and in a second cycle, treating the SiB layer with a plasma comprising a nitrogen-containing gas to form a conformal SiBN film, wherein a single cycle of the chemical vapor deposition process deposits a film having a thickness in a range of from about 10 Angstroms (Å) to about 30 Angstroms (Å), and the method is performed at a temperature in a range of from 300° C. to 550° C.

In another embodiment, a method of forming a film on a substrate comprises in a first cycle, depositing a SiB layer on a substrate in a chamber using a chemical vapor deposition process, the substrate having at least one feature thereon, the at least one feature comprising an upper surface, a bottom surface and sidewalls, the SiB layer formed on the upper surface, the bottom surface and the sidewalls; purging the chamber with an inert gas; and in a second cycle, treating the SiB layer with a plasma comprising a gas including at least one of Ar, $N_2$, He, $NH_3$ and $H_2$ to form a conformal SiBN film, wherein a single cycle of the chemical vapor deposition process deposits a film having a thickness in a range of from about 10 Å to about 30 Å and the method is performed at a temperature in a range of from 300° C. to 550° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
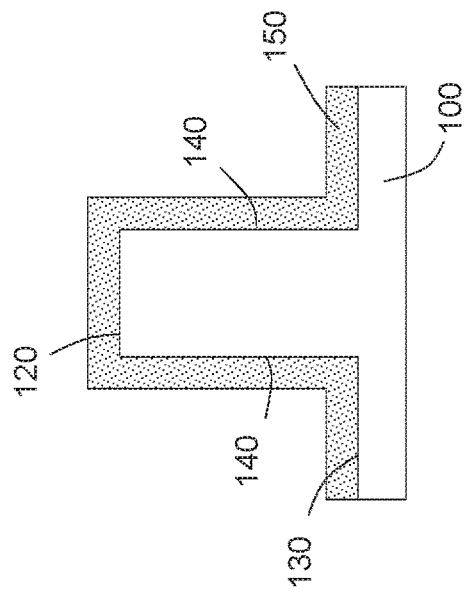
FIGS. 1A through 1D show a substrate and a filmed formed thereon according to a processing method in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Some embodiments of the disclosure are directed to SiBN deposition methods that allow for different film properties based on the deposition location on a 3D structure. For example, a film deposited on the top and bottom of a structure can be treated to have different film properties than a film deposited on the sidewall of the structure. Some embodiments of the disclosure advantageously provide methods of forming a film in which wet etching can selectively remove portions of the film (e.g., the top and bottom) while leaving other portions of the film (e.g., the sidewall) as a spacer. Some embodiments of the disclosure are advantageously performed in a single processing chamber.

In some embodiments, the silicon boron nitride selective deposition includes two processes in a single processing chamber: SiBN film deposition and plasma treatment. A batch processing chamber can be used to conduct a SiB chemical vapor deposition (CVD) process; a plasma (e.g., radio frequency (RF) plasma) treatment with, for example, $N_2$ or $NH_3$ and options $H_2$ gases (which can be mixed with inert gases such as Ar or He). The silicon and boron precursors form a conformal SiB film, and the plasma treatment modifies the film on the top and bottom of the feature. In some embodiments, the RF plasma treatment uses a hardware configured to have a directional treatment effect on the SiB film. Deposition in some embodiments is performed at substrate temperatures in the range of about 200° C. to about 550° C.

Referring to FIGS. 1A through 1D, one or more embodiments of the disclosure are directed to processing methods to deposit a film, for example, a spacer film on a substrate 100 having a feature 110 thereon. The feature 110 can be any three-dimensional structure. The feature 110 shown in FIGS. 1A-1D is a mesa, however, those skilled in the art will understand that this is merely representative of one possible structure. Suitable features include, but are not limited to, ridges, trenches and vias.

The feature 110 shown in FIGS. 1A-1D includes an upper surface 120, a bottom surface 130 and sidewalls 140. In the embodiment shown, the feature 110 has two sidewalls 140 on opposite sides of the feature 110 in the form of a mesa. The feature 110 has a height defined by upper surface 120 and the bottom surface 130 and a width defined by the distance between the sidewalls 140.

Figure 1B:
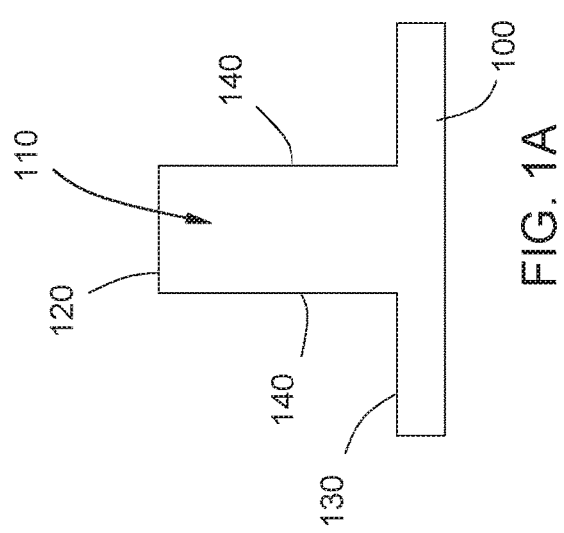

The substrate 100 comprises the at least one feature 110 thereon. As shown in FIG. 1B, a film 150 is formed on the substrate 100 so that the film forms on the at least one feature 110. The film 150 forms on the upper surface 120, bottom surface 130 and sidewalls 140 of the feature 110. In some embodiments, the film 150 forms conformally on the feature 110.

In one or more embodiments, the terms "conformal", "conformality" or "conformally" is typically quantified by a ratio (which may be represented as a percentage) of the average thickness of a layer deposited on the sidewalls of a feature to the average thickness of the same deposited layer on the field, or upper surface, of the substrate. Layers deposited by the methods described herein are observed to have a conformality of greater than about 30%, for example, greater than 40%, greater than 50%, greater than 60%, greater than 70% (greater than 7:10), greater than 80% (greater than 4:5), greater than 85% (greater than 8.5:10), greater than 90% (greater than 9:10), greater than 95% (greater than 9.5:10), greater than 96% (greater than 9.6:10), greater than 97% (greater than 9.7:10), greater than 98% (greater than 9.8:10) greater than 99% (greater than 9.9:10) to about 100%, (1:1). In specific embodiments, the terms "conformal", "conformality" or "conformally", refer to a layer that adheres to and uniformly covers exposed surfaces with a thickness having a variation of less than 1% relative to the average thickness of the film. For example, a 1,000 Å thick film would have less than a 10 Å variation in thickness. This thickness and variation includes edges, corners, sides, and the bottom of recesses. For example, a conformal layer according to one or more embodiments of the disclosure would provide coverage over the deposited region of essentially uniform thickness on complex surfaces.

In one or more embodiments, the film 150 comprises or is SiB. The formation of the SiBN is performed by plasma-enhanced chemical vapor deposition (PECVD). In some embodiments, the film 150 comprising SiB is formed by thermally reacting a silicon precursor and a boron precursor in a PECVD chamber to form a SiB on the upper surface 120, the sidewalls 140 and the bottom surface 130.

Suitable silicon precursors include, but are not limited to, silane, disilane, dichlorisilane (DCS), bis(diethylamino)silane (BDEAS), tetrakis(dimethylamino)silane (TDMAS) and/or bis(tertiary-butylamino)silane (BTBAS). In some embodiments, the silicon precursor comprises dichlorosilane.

Suitable boron precursors include, but are not limited to, boranes, alkylboranes and haloboranes. In some embodiments, the boron precursor comprises one or more species with a general formula of $B_cH_dX_eR_f$, where each X is a halogen independently selected from F, Cl, Br and I, each R is an independently selected C1-C4 alkyl group, c is any integer greater than or equal to 2, each of d, e and f are less than or equal to c+2 and d+e+f is equal to c+2.

According to one or more embodiments, after formation of the SiB film, the SiB film is treated using plasma nitridation. In one or more embodiments, a plasma is formed in a PECVD chamber by flowing a nitrogen containing gas. Suitable nitrogen-containing gases include, but are not limited to, molecular nitrogen and ammonia. Additional gases such as Ar, He and/or $H_2$ may be flowed during plasma nitridation. The plasma nitridation is performed by exposing the SiB film to plasma that includes, but is not limited to, nitrogen plasma, ammonia plasma, a plasma comprising a mixture of two or more of hydrogen, nitrogen, ammonia, helium, argon, hydrogen, and/or oxygen. In some embodiments, the plasma comprises a plasma of argon and ammonia, or a plasma of argon and nitrogen, or a plasma of argon and oxygen, or a plasma of helium and ammonia.

Figure 1C:
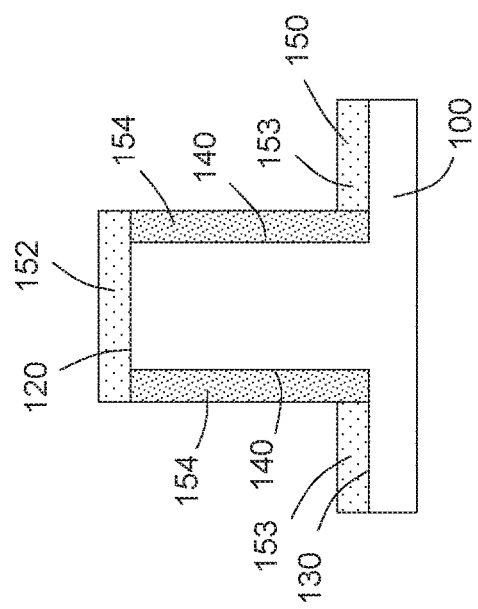

As shown in FIG. 1C, after formation of the film 150 (e.g., SiB), the film 150 is treated with a plasma 160 having a high ion concentration. In some embodiments, the plasma 160 can be a directional plasma. As used in this specification and the appended claims, the term "directional plasma" means that the energetic species present in the plasma (ions and radicals) move in a specified direction. For example, in FIG. 1C, the plasma 160 is illustrated moving downward so that the energetic species are able to contact the film 150 on the top surface 120 and bottom surface 130 but have minimal contact with the film 150 on the sidewalls 140.

A plasma with a high ion concentration has a concentration greater than or equal to about $10^{10}/cm^3$. In one or more embodiments, the plasma with the high ion concentration has a concentration greater than or equal to about $10^9/cm^3$, $10^{11}/cm^3$, $10^{12}/cm^3$, $10^{13}/cm^3$ or $10^{14}/cm^3$.

A directional plasma can be formed as a remote plasma in which the plasma species are excited remotely from the substrate and flow toward the substrate. The substrate and substrate support may not be part of the electrical path used to generate the plasma. A directional plasma may also be formed as a direct plasma in which the substrate or substrate support serve as an electrode in the plasma formation. A directional plasma is generally a diffuse plasma and can be made directional by applying a bias to the substrate so that the ions are attracted to and move toward the substrate.

Figure 1D:
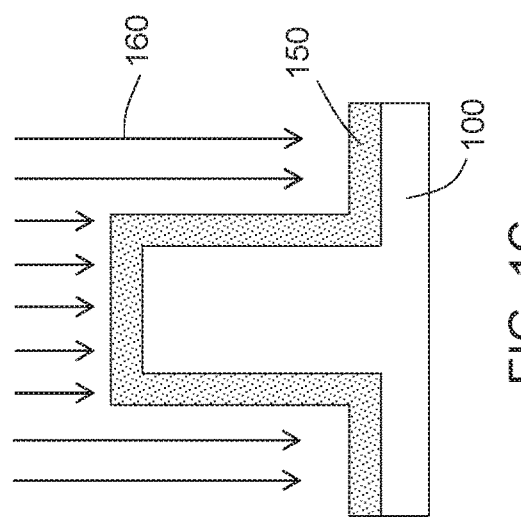

As shown in FIG. 1D, treating the film 150 with the plasma modifies a property of the film 150 at the upper surface 120 and bottom surface 130. In some embodiments, the property of the film 150 that is changed is the addition of nitrogen to the film 150 to form SiBN.

The plasma used in the treatment can be any suitable plasma (e.g., direct or remote) which is capable of modifying the film properties. In some embodiments, the treatment comprises one or more of hydrogen, argon, nitrogen, ammonia, oxygen or helium.

The formation and treatment of the film 150 can be repeated until a film with a predetermined total thickness has been formed. The film can then be treated and, if desire, the process repeated. In some embodiments, treating the film 150 with the plasma 160 occurs after a film having a thickness in the range of from about 10 Å to about 30 Å is deposited. In some embodiments, the film 150 has a thickness in a range of from about 10 Å to about 25 Å, from about 10 Å to about 20 Å, from about 10 Å to about 15 Å, from about 15 Å to about 35 Å, from about 15 Å to about 25 Å, from about 15 Å to about 20 Å, from about 20 Å to about 30 Å, or from about 20 Å to about 25 Å.

In some embodiments of the method, the film 150 is etched. The modified top film 152 and modified bottom film 153 are selectively etched relative to the sidewall film 154. As used in this regard, selectively etching means that the amount, rate, or degree of etching on the top and bottom is greater than the etching on the sidewall. In some embodiments, the film is etched with dilute HF to selectively remove the film from the top and bottom of the feature. FIG. 1D shows the result of an etch process. While the drawing shows square corners for the top and bottom of the feature 110 and the sidewall film 154, those skilled in the art will understand that this is merely illustrative and that the edges and corners are not perfectly straight or square.

Figure 2A:
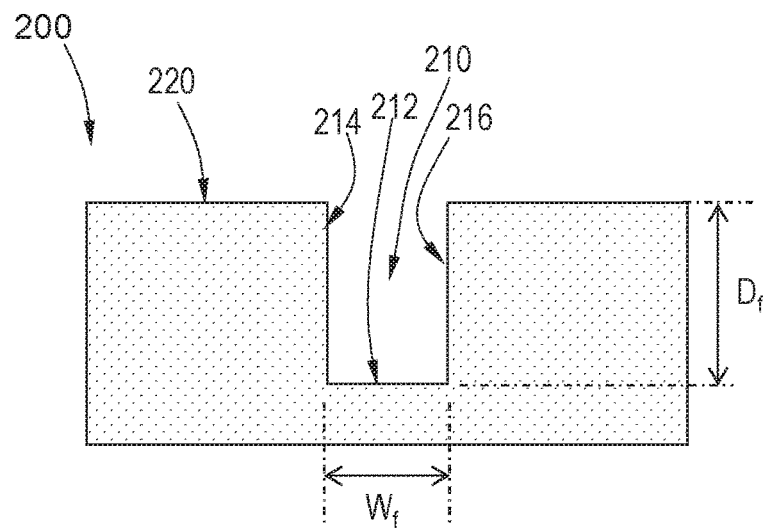
FIG. 2A illustrates a cross-sectional view of a substrate according to one or more embodiments.
Figure 2B:
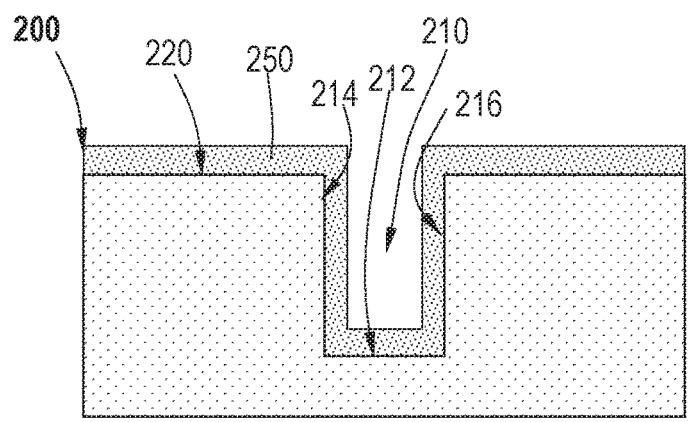
FIG. 2B illustrates a cross-sectional view of a substrate according to one or more embodiments.

Referring now to FIGS. 2A and 2B, an advantage of the inventive method is improved conformality of films deposited on features compared with existing PECVD deposition processes. FIG. 2A shows a partial cross-sectional view of a substrate 200 with a feature 210 in the form of a trench. In one or more embodiments, the substrate 200 has an upper surface 220. The at least one feature 210 forms an opening in the upper surface 220. The feature 210 extends from the upper surface 220 to a depth $D_f$ to a bottom surface 212. The feature 210 has a first sidewall 214 and a second sidewall 216 that define a width $W_f$ of the feature 210. The open area formed by the sidewalls and bottom are also referred to as a gap.

FIG. 2B illustrates a schematic cross-sectional view of a substrate 200 with a feature 210 and a SiBN film 250 formed thereon. The SiBN film 250 illustrates the typical appearance of a film deposited using the inventive method. Qualitatively, the SiBN film 250 is highly conformal and completely covers sidewalls 214, 216 and bottom surface 212 of feature 210. Quantitatively, the SiBN film 250 has a conformality on the order of from about 30% to about 100%. For example, from about 70% to about 90%, wherein conformality is defined as the ratio of the average thickness of the SiBN film 250 deposited on the sidewalls 214, 216 to the average thickness T of SiBN film 250 on upper surface 220 of substrate 200.

Films by the methods described herein are observed to have a conformality of greater than about 30%, for example, greater than 40%, greater than 50%, greater than 60%, greater than 70% (greater than 7:10), greater than 80% (greater than 4:5), greater than 85% (greater than 8.5:10), greater than 90% (greater than 9:10), greater than 95% (greater than 9.5:10), greater than 96% (greater than 9.6:10), greater than 97% (greater than 9.7:10), greater than 98% (greater than 9.8:10) greater than 99% (greater than 9.9:10) to about 100%, (1:1). In specific embodiments, the terms "conformal", "conformality" or "conformally", refer to a layer that adheres to and uniformly covers exposed surfaces with a thickness having a variation of less than 1% relative to the average thickness of the film. For example, a 1,000 Å thick film would have less than a 10 Å variation in thickness.

Figure 3:
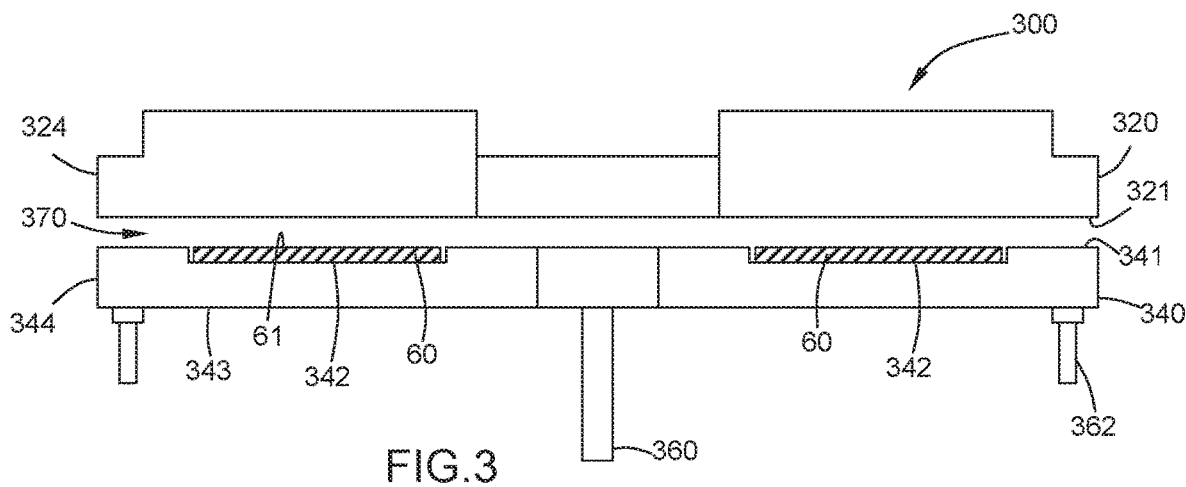
FIG. 3 shows a cross-sectional view of a batch processing chamber in accordance with one or more embodiment of the disclosure.

Some embodiments of the disclosure are directed to processes of depositing a spacer material a substrate processing chamber. FIG. 3 shows a cross-section of a processing chamber 300 including a gas distribution assembly 320, also referred to as injectors or an injector assembly, and a susceptor assembly 340. The gas distribution assembly 320 is any type of gas delivery device used in a processing chamber. The gas distribution assembly 320 includes a front surface 321 which faces the susceptor assembly 340. The front surface 321 can have any number or variety of openings to deliver a flow of gases toward the susceptor assembly 340. The gas distribution assembly 320 also includes an outer edge 324 which in the embodiment shown, is substantially round.

The specific type of gas distribution assembly 320 used can vary depending on the particular process being used. Embodiments of the disclosure can be used with any type of processing system where the gap between the susceptor and the gas distribution assembly is controlled. Various types of gas distribution assemblies can be employed for example, showerheads. In some embodiments, the gas distribution assembly 320 is a rigid stationary body made of a single injector unit. In one or more embodiments, the gas distribution assembly 320 is made up of a plurality of individual sectors. Either a single piece body or a multi-sector body can be used with the one or more embodiments of the disclosure.

A susceptor assembly 340 is positioned beneath the gas distribution assembly 320. The susceptor assembly 340 includes a top surface 341 and at least one recess 342 in the top surface 341. The susceptor assembly 340 also has a bottom surface 343 and an edge 144. The recess 342 can be any suitable shape and size depending on the shape and size of the substrates 60 being processed. In the embodiment shown in FIG. 3, the recess 342 has a flat bottom to support the bottom of the substrate; however, the bottom of the recess can vary. In some embodiments, the recess has step regions around the outer peripheral edge of the recess which are sized to support the outer peripheral edge of the substrate. The amount of the outer peripheral edge of the substrate that is supported by the steps can vary depending on, for example, the thickness of the substrate and the presence of features already present on the back side of the substrate.

In some embodiments, as shown in FIG. 3, the recess 342 in the top surface 341 of the susceptor assembly 340 is sized so that a substrate 60 supported in the recess 342 has a top surface 261 substantially coplanar with the top surface 341 of the susceptor 340. As used in this specification and the appended claims, the term "substantially coplanar" means that the top surface of the substrate and the top surface of the susceptor assembly are coplanar within ±0.2 mm. In some embodiments, the top surfaces are coplanar within ±0.15 mm, ±0.10 mm or ±0.05 mm.

The susceptor assembly 340 of FIG. 3 includes a support post 360 which is capable of lifting, lowering and rotating the susceptor assembly 340. The susceptor assembly may include a heater, or gas lines, or electrical components within the center of the support post 360. The support post 360 may be the primary means of increasing or decreasing the gap between the susceptor assembly 340 and the gas distribution assembly 320, moving the susceptor assembly 340 into proper position. The susceptor assembly 340 may also include fine tuning actuators 362 which can make micro-adjustments to susceptor assembly 340 to create a predetermined gap 370 between the susceptor assembly 340 and the gas distribution assembly 320.

In some embodiments, the gap 370 distance is in the range of about 4.5 mm to about 25.0 mm, or in the range of about 4.5 mm to about 20.0 mm, or in the range of about 4.5 mm to about 15 mm, or in the range of about 4.5 mm to about 10 mm, or in the range of about 5 mm to about 25 mm, or in the range of about 5 mm to about 20 mm, or in the range of about 5 mm to about 15 mm, or in the range of about 5 mm to about 10 mm.

The processing chamber 300 shown according to one or more embodiments is a carousel-type chamber in which the susceptor assembly 340 can hold a plurality of substrates 60.

Embodiments of the disclosure are directed to processing methods for forming a film on a substrate. In a first embodiment, a method of forming a film on a substrate comprises in a first cycle, depositing a SiB layer on a substrate in a chamber using a chemical vapor deposition process, the substrate having at least one feature thereon, the at least one feature comprising an upper surface, a bottom surface and sidewalls, the SiB layer formed on the upper surface, the bottom surface and the sidewalls. In a second cycle, the method further comprises treating the SiB layer with a plasma comprising a nitrogen-containing gas to form a conformal SiBN film. In some embodiments, the feature comprises an opening in the upper surface extending from the upper surface to a depth $D_f$ to the bottom surface, the sidewalls including a first sidewall and a second sidewall defining a width $W_f$ of the feature. In specific embodiments, the chemical vapor deposition process comprises flowing silane and diborane into the chamber. In other embodiments, the feature comprises a mesa having two sidewalls on opposite sides of the mesa and a height defined by the upper surface and the bottom surface and a width defined by the distance between the sidewalls.

One or more embodiments further comprise terminating the chemical vapor deposition process, purging the chamber with an inert gas and treating the SiB layer with a plasma after purging the chamber. In some embodiments, the plasma comprises $N_2$ and Ar. In some embodiments, the plasma comprises $N_2$ and He. In some embodiments, the plasma comprises $NH_3$. In some embodiments, the plasma further comprises $H_2$. In some embodiments, flowing H2 improves film properties such as dielectric constant. In some embodiments, the method is performed at a temperature in a range of from 300° C. to 550° C. In some embodiments, the chemical vapor deposition process comprises flowing silane and diborane into the chamber, terminating the chemical vapor deposition process, purging the chamber with an inert gas and treating the SiB layer with a plasma after purging the chamber. In one or more embodiments, the plasma is a radio frequency RF plasma is in a range of from 100 W to 2 kW, and in specific embodiments, in a range of rom 100 W to 1 kW. In one or more embodiments, the gap 370 distance discussed above is in the range of about 4.5 mm to about 25.0 mm, and in specific embodiments in a range of from 5 mm to 15 mm. In one or more embodiments, the pressure in the processing chamber during the plasma treatment is in a range of from 2 Torr to 50 Torr, and in specific embodiments from 3 Torr to 25 Torr.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film on a substrate comprising:
   in a first cycle, depositing a SiB layer on a substrate in a chamber using a chemical vapor deposition process, the substrate having at least one feature thereon, the at least one feature comprising an upper surface, a bottom surface, and sidewalls including a first sidewall and a second sidewalls, the SiB layer formed on the upper surface, the bottom surface and the sidewalls; and
   in a second cycle, treating the SiB layer with a plasma comprising a nitrogen-containing gas to form a conformal SiBN film, wherein the method is performed at a temperature in a range of from 300° C. to 550° C., and the film has a ratio of an average thickness deposited on the first sidewall and the second sidewall of the feature to an average thickness of the same film on the upper surface of greater than 90%.

2. The method of claim 1, wherein a single cycle of the chemical vapor deposition process deposits a film having a thickness in a range of from about 10 Å to about 30 Å.

3. The method of claim 2, wherein the feature comprises an opening in the upper surface extending from the upper surface to a depth $D_f$ to the bottom surface, the first sidewall and the second sidewall defining a width $W_f$ of the feature.

4. The method of claim 3, wherein the film has a ratio of an average thickness deposited on the first sidewall and second sidewall of the feature to an average thickness of the same film on the upper surface of greater than 95%.

5. The method of claim 4, wherein the chemical vapor deposition process comprises flowing silane and diborane into the chamber.

6. The method of claim 5, further comprising terminating the chemical vapor deposition process, purging the chamber with an inert gas and treating the SiB layer with a plasma after purging the chamber.

7. The method of claim 6, wherein the plasma comprises of one or more of the following: $N_2$, Ar, He, and $NH_3$.

8. The method of claim 7, wherein the plasma further comprises $H_2$.

9. The method of claim 7, wherein the method is performed at a temperature in a range of from 300° C. to 550° C.

10. The method of claim 2, wherein the feature comprises a mesa having the first sidewall and the second sidewall on opposite sides of the mesa and a height defined by the upper surface and the bottom surface and a width defined by a distance between the sidewalls.

11. The method of claim 10, wherein the film has a ratio of an average thickness deposited on the sidewalls of the feature to an average thickness of the same film on the upper surface of greater than 95%.

12. The method of claim 11, wherein the chemical vapor deposition process comprises flowing silane and diborane into the chamber, terminating the chemical vapor deposition process, purging the chamber with an inert gas and treating the SiB layer with a plasma after purging the chamber.

13. The method of claim 12, wherein the plasma comprises of one or more of the following: $N_2$, Ar, He, and $NH_3$.

14. The method of claim 1, wherein a single cycle of the chemical vapor deposition process deposits a film having a thickness in a range of from about 10 Å to about 25 Å.

15. The method of claim 1, wherein a single cycle of the chemical vapor deposition process deposits a film having a thickness in a range of from about 15 Å to about 30 Å.

16. The method of claim 15, wherein a single cycle of the chemical vapor deposition process deposits a film having a thickness in a range of from about 15 Å to about 25 Å.

17. A method of forming a film on a substrate comprising:
   in a first cycle, depositing a SiB layer on a substrate in a chamber using a chemical vapor deposition process, the substrate having at least one feature thereon, the at least one feature comprising an upper surface, a bottom surface and sidewalls, the SiB layer formed on the upper surface, the bottom surface and the sidewalls; and
   in a second cycle, treating the SiB layer with a plasma comprising a nitrogen-containing gas to form a conformal SiBN film, wherein a single cycle of the chemical vapor deposition process deposits a film having a thickness in a range of from about 10 Å to about 30 Å and the method is performed at a temperature in a range of from 300° C. to 550° C., wherein the film has a ratio of an average thickness deposited on the sidewalls of the feature to an average thickness of the same film on the upper surface of greater than 90%.

18. A method of forming a film on a substrate comprising:
   in a first cycle, depositing a SiB layer on a substrate in a chamber using a chemical vapor deposition process, the substrate having at least one feature thereon, the at least one feature comprising an upper surface, a bottom surface and sidewalls, the SiB layer formed on the upper surface, the bottom surface and the sidewalls;

purging the chamber with an inert gas; and in a second cycle, treating the SiB layer with a plasma comprising a gas including one or of Ar, $N_2$, He, $NH_3$ and $H_2$ to form a conformal SiBN film, wherein a single cycle of the chemical vapor deposition process deposits a film having a thickness in a range of from about 10 Å to about 30 Å and the method is performed at a temperature in a range of from 300° C. to 550° C., wherein the film has a ratio of an average thickness deposited on the sidewalls of the feature to an average thickness of the same film on the upper surface of greater than 90%.

* * * * *